(12) United States Patent
Lee et al.

(10) Patent No.: US 11,107,860 B2
(45) Date of Patent: Aug. 31, 2021

(54) ORGANIC IMAGE SENSORS WITHOUT COLOR FILTERS

(71) Applicant: Samsung Electronics Co., Ltd., Suwon-si (KR)

(72) Inventors: Gae Hwang Lee, Seongnam-si (KR); Kwang Hee Lee, Hwaseong-si (KR); Sung Young Yun, Suwon-si (KR); Dong-Seok Leem, Hwaseong-si (KR); Yong Wan Jin, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 32 days.

(21) Appl. No.: 16/265,264

(22) Filed: Feb. 1, 2019

(65) Prior Publication Data
US 2019/0245009 A1 Aug. 8, 2019

(30) Foreign Application Priority Data

Feb. 6, 2018 (KR) .................. 10-2018-0014579
Oct. 17, 2018 (KR) .................. 10-2018-0123911

(51) Int. Cl.
*H01L 27/30* (2006.01)
*H01L 27/28* (2006.01)

(52) U.S. Cl.
CPC .......... *H01L 27/307* (2013.01); *H01L 27/281* (2013.01); *H01L 27/286* (2013.01)

(58) Field of Classification Search
CPC ................ H01L 25/167; H01L 31/107; H01L 27/14643–14663; H01L 27/307; H01L 27/281; H01L 27/286
See application file for complete search history.

(56) References Cited

U.S. PATENT DOCUMENTS

| 6,300,612 | B1 | 10/2001 | Yu |
| 7,129,466 | B2 | 10/2006 | Iwasaki |
| 7,737,475 | B2 | 6/2010 | Hynecek |
| 7,973,307 | B2 | 7/2011 | Rand et al. |
| 8,035,708 | B2 | 10/2011 | Takizawa et al. |

(Continued)

FOREIGN PATENT DOCUMENTS

| EP | 2568517 A1 | 3/2013 |
| EP | 3113225 A1 | 1/2017 |

(Continued)

OTHER PUBLICATIONS

Bahro, Daniel et al. "Tandem organic solar cells revisited." *Nature Photonics* 10 (2016): 354-355.

(Continued)

*Primary Examiner* — Cuong B Nguyen
(74) *Attorney, Agent, or Firm* — Harness, Dickey & Pierce, P.L.C.

(57) ABSTRACT

An organic image sensor may be configured to obtain a color signal associated with a particular wavelength spectrum of light absorbed by the organic image sensor may omit a color filter. The organic image sensor may include an organic photoelectric conversion layer including a first material and a second material. The first material may absorb a first wavelength spectrum of light, and the second material may absorb a second wavelength spectrum of light. The organic photoelectric conversion layer may include stacked upper and lower layers, and the respective material compositions of the lower and upper layers may be first and second mixtures of the first and second materials. A ratio of the first material to the second material in the first mixture may be greater than 1/1, and a ratio of the first material to the second material in the second mixture may be less than 1/1.

18 Claims, 13 Drawing Sheets

(56) References Cited

U.S. PATENT DOCUMENTS

| | | | |
|---|---|---|---|
| 8,148,762 B2 | 4/2012 | Joe et al. | |
| 8,426,727 B2 | 4/2013 | Pfeiffer et al. | |
| 8,686,479 B2 | 4/2014 | Hynecek | |
| 9,300,887 B2 | 3/2016 | Lee et al. | |
| 9,548,337 B2 | 1/2017 | Lee et al. | |
| 10,008,521 B2 | 6/2018 | Sekine | |
| 2005/0217722 A1* | 10/2005 | Komatsu | B82Y 10/00 136/263 |
| 2007/0012955 A1 | 1/2007 | Ihama | |
| 2009/0294761 A1 | 12/2009 | Kim et al. | |
| 2012/0313088 A1 | 12/2012 | Yofu et al. | |
| 2013/0062595 A1* | 3/2013 | Park | H01L 51/4253 257/40 |
| 2015/0207087 A1 | 7/2015 | Udaka et al. | |
| 2017/0005142 A1* | 1/2017 | Lee | H01L 27/307 |
| 2017/0104162 A1 | 4/2017 | Rosselli et al. | |
| 2018/0227526 A1* | 8/2018 | Tokuhara | H01L 27/14612 |

FOREIGN PATENT DOCUMENTS

| | | | |
|---|---|---|---|
| JP | 2008283058 A | 11/2008 | |
| JP | 5252783 B2 | 7/2013 | |
| JP | 201556408 A | 3/2015 | |
| KR | 100905230 B1 | 7/2009 | |
| KR | 20090123540 A | 12/2009 | |
| KR | 101385250 B1 | 4/2014 | |
| KR | 20140125057 A | 10/2014 | |
| WO | WO-2009/056626 A1 | 5/2009 | |
| WO | WO-2010038721 A1 | 4/2010 | |
| WO | WO-2014024581 A1 | 2/2014 | |
| WO | WO-2017/159025 A1 | 9/2017 | |

OTHER PUBLICATIONS

NPL_Tandem_Organic_Jun. 2016.

S.M. Schultes et al., "The role of molecular architecture and layer composition on the properties and performance of CuPC-C60 photovoltaic devices", Materials Science & Engineering C, vol. 25, No. 5-8, p. 858-865 (Dec. 1, 2005).

Extended European Search Report dated Jun. 26, 2019 for corresponding European Application No. 19155806.3.

European Communication pursuant to Article 94(3) EPC dated Apr. 13, 2021 for corresponding European Application No. 19155806.3.

* cited by examiner

ORGANIC IMAGE SENSORS WITHOUT COLOR FILTERS

CROSS-REFERENCE TO RELATED APPLICATIONS

This application claims priority to and the benefit of, under 35 U.S.C. § 119, Korean Patent Application No. 10-2018-0014579 filed in the Korean Intellectual Property Office on Feb. 6, 2018 and Korean Patent Application No. 10-2018-0123911 filed in the Korean Intellectual Property Office on Oct. 17, 2018, the entire contents of each of which are incorporated herein by reference.

BACKGROUND

1. Field

Example embodiments relate to image sensors. More particularly, example embodiments relate to organic image sensors without color filters.

2. Description of the Related Art

In some cases, an organic/inorganic stacked image sensor may be formed by stacking a green organic photodiode and a silicon photodiode, where the silicon photodiode includes a red silicon photodiode and a blue silicon photodiode.

In some cases, a color filter is included in the organic/inorganic stacked image sensor to configure the image sensor to obtain ("generate") a desirable red, green, and blue (RGB, or CMY) color signal based on incident light on the image sensor. In some cases, when the color filter is present between the organic photodiode and the silicon photodiode of the image sensor, a process of operating the image sensor and/or manufacturing the image sensor may become difficult and complicated due to a thickness (about 500-1000 nm) of the color filter. In addition, a distance between the organic photodiode and the silicon photodiode may be almost several hundreds of nanometers, so optical crosstalk between the organic photodiode and the photodiodes of the silicon photodiode may be increased. Also, it may be difficult to provide an electrode in a depth direction.

When the color filter is present on the organic photodiode in the image sensor, the color filter may filter a CMY (Cyan, Magenta, Yellow) color, but CMY color filters may be difficult to provide a fine pattern and has a low color purity, so that it may be difficult to apply a CMY filter in an image sensor product.

Furthermore, a color filter that may be included in an image sensor may include an organic material such as a colorant (pigment or dye) and may be formed according a process such as a spin coating, a UV exposure, a dry etching, so there is a limit to reduce a pattern size or a thickness until less than or equal to about 1 um. Accordingly, a color filter included in an image sensor may degrade performance and/or resolution of the image sensor.

SUMMARY

Some example embodiments provide an image sensor in which an organic photodiode may be configured to detect a particular wavelength spectrum of incident light (e.g., generate a particular color signal) without including a color filter.

By controlling a voltage applied to an organic photoelectric conversion device, an image sensor may be configured to implement method of driving an image sensor to improve SNR according to the environment.

According to some example embodiments, an organic image sensor may include an organic photoelectric conversion layer including a first material and a second material, where the first material is configured to absorb a first wavelength spectrum of light, and the second material is configured to absorb a second wavelength spectrum of light. The organic photoelectric conversion layer may include a lower layer and an upper layer stacked upon the lower layer. A material composition of the lower layer may be a first mixture of the first and second materials. A material composition of the upper layer may be a second mixture of the first and second materials. A ratio of the first material to the second material in the first mixture may be greater than 1/1, and a ratio of the first material to the second material in the second mixture may be less than 1/1.

The ratio of the first material to the second material in the first mixture may be greater than 3/1. The ratio of the first material to the second material in the second mixture may be less than 1/3.

The organic image sensor may further include a common electrode on one side of the organic photoelectric conversion layer and a plurality of pixel electrodes on an opposite side of the organic photoelectric conversion layer. The plurality of pixel electrodes may define separate, first and second organic photoelectric conversion devices in the organic image sensor, such that the first organic photoelectric conversion device includes a first pixel electrode of the plurality of pixel electrodes, a first portion of the organic photoelectric conversion layer and a first portion of the common electrode, and the second organic photoelectric conversion device includes a separate, second pixel electrode of the plurality of pixel electrodes, a separate, second portion of the organic photoelectric conversion layer and a separate, second portion of the common electrode.

The organic image sensor may be configured to apply a first voltage in the first organic photoelectric conversion device and apply a second voltage in the second organic photoelectric conversion device, wherein the first voltage and the second voltage are applied concurrently.

A magnitude of the second voltage may be greater than a magnitude of the first voltage.

The organic image sensor may be configured to configure the first organic photoelectric conversion device to generate a signal associated with one light of the first light and the second light based on the organic image sensor applying a first voltage to the first organic photoelectric conversion device and the organic image sensor being irradiated with incident light that includes the first light and the second light, and configure the second organic photoelectric conversion device to generate a signal associated with a separate light of the first light and the second light based on the organic image sensor applying a separate, second voltage to the second organic photoelectric conversion device and the organic image sensor being irradiated with the incident light.

According to some example embodiments, an organic/inorganic stacked image sensor may include a plurality of inorganic photoelectric conversion devices within a semiconductor substrate, and an organic photoelectric conversion layer on the semiconductor substrate. The organic photoelectric conversion layer may include a first material and a second material. The first material may be configured to absorb a first wavelength spectrum of light. The second material may be configured to absorb a second wavelength spectrum of light. The organic photoelectric conversion layer may include a lower layer and an upper layer stacked upon the lower layer. A material composition of the lower layer may be a first mixture of the first and second materials. A material composition of the upper layer may be a second mixture of the first and second materials. A ratio of the first material to the second material in the first mixture may be greater than 1/1, and a ratio of the first material to the second material in the second mixture may be less than 1/1. The organic/inorganic stacked image sensor may include first and second organic photoelectric conversion devices, the first organic photoelectric conversion device including a first portion of the organic photoelectric conversion layer and configured to absorb a first light, the second organic photoelectric conversion device including a separate, second portion of the organic photoelectric conversion layer and configured to absorb a separate, second light. Each inorganic photoelectric conversion device of the plurality of inorganic photoelectric conversion devices may be configured to absorb a third light which is not absorbed by the first organic photoelectric conversion device and the second organic photoelectric conversion device. The organic/inorganic stacked image sensor may not include any color filter device.

The ratio of the first material to the second material in the first mixture may be greater than 3/1. The ratio of the first material to the second material in the second mixture may be less than 1/3.

The organic/inorganic stacked image sensor may further include a common electrode on one side of the organic photoelectric conversion layer and a plurality of pixel electrodes on an opposite side of the organic photoelectric conversion layer. The plurality of pixel electrodes may define the separate, first and second organic photoelectric conversion devices in the organic image sensor, such that the first organic photoelectric conversion device includes a first pixel electrode of the plurality of pixel electrodes, the first portion of the organic photoelectric conversion layer and a first portion of the common electrode, and the second organic photoelectric conversion device includes a separate, second pixel electrode of the plurality of pixel electrodes, the separate, second portion of the organic photoelectric conversion layer and a separate, second portion of the common electrode.

The organic image sensor may be configured to apply a first voltage in the first organic photoelectric conversion device and apply a second voltage in the second organic photoelectric conversion device, wherein the first voltage and the second voltage are applied concurrently.

A magnitude of the second voltage may be greater than a magnitude of the first voltage.

The organic/inorganic stacked image sensor may be configured to configure the first organic photoelectric conversion device to generate a signal associated with one light of the first light and the second light based on the organic image sensor applying a first voltage to the first organic photoelectric conversion device and the organic image sensor being irradiated with incident light that includes the first light and the second light, and configure the second organic photoelectric conversion device to generate a signal associated with a separate light of the first light and the second light based on the organic image sensor applying a separate, second voltage to the second organic photoelectric conversion device and the organic image sensor being irradiated with the incident light.

The organic/inorganic stacked image sensor may further include an interlayer insulation layer between an upper surface of the semiconductor substrate and an exposed lower surface of the organic photoelectric conversion layer, and a contact configured to couple the first organic photoelectric conversion device and the second organic photoelectric conversion device with a charge storage section on the semiconductor substrate.

The organic/inorganic stacked image sensor may further include a planarization layer and a microlens array layer on the common electrode.

According to some example embodiments, an organic image sensor may include an organic photoelectric conversion layer including a first material and a second material. The first material may be configured to absorb a first wavelength spectrum of light. The second material may be configured to absorb a second wavelength spectrum of light. The organic photoelectric conversion layer may include a lower layer and an upper layer stacked upon the lower layer. A material composition of the lower layer may be a first mixture of the first and second materials. A material composition of the upper layer may be a second mixture of the first and second materials. A ratio of the first material to the second material in the first mixture may be greater than 1/1. A ratio of the first material to the second material in the second mixture may be less than 1/1. The organic image sensor may include a common electrode on one side of the organic photoelectric conversion layer, and a plurality of pixel electrodes on an opposite side of the organic photoelectric conversion layer. The organic image sensor may be configured to apply different voltages to separate pixel electrodes of the plurality of pixel electrodes.

The organic image sensor may be configured to operate in a normal operation mode, wherein a first voltage is applied to a first set of one or more pixel electrodes of the plurality of pixel electrodes, a second voltage is applied to a separate, second set of one or more pixel electrodes of the pixel electrodes, and a ratio of the first set of one or more pixel electrodes to the second set of one or more pixel electrodes is 1/1.

The organic image sensor may be configured to operate in a mode different from the normal operation mode, wherein the ratio of the first set of one or more pixel electrodes to the second set of one or more pixel electrodes is different from 1/1.

The organic image sensor may further include an interlayer insulating layer directly on a lower surface of the plurality of pixel electrodes and an exposed lower surface of the organic photoelectric conversion layer, a semiconductor substrate on the interlayer insulating layer, the semiconductor substrate including a charge storage section configured to store a charge accumulated in a first organic photoelectric conversion device and a second organic photoelectric conversion device, an inorganic photoelectric conversion device at least partially in the semiconductor substrate, the inorganic photoelectric conversion device configured to absorb a third light that is different from the first light and the second light, and a contact in the interlayer insulating layer, the contact configured to couple the first organic photoelectric conversion device and the second organic photoelectric conversion device with the charge storage section.

According to some example embodiments, an organic image sensor may include a plurality of organic photoelectric conversion devices. Each organic photoelectric conversion device of the plurality of organic photoelectric conversion devices may include a separate organic photoelectric conversion layer including one or more layers. Each layer of the one or more layers of each separate organic photoelectric conversion layer may include a particular mixture of a first material and a second material. The first material may be configured to absorb a first wavelength spectrum of light. The second material may be configured to absorb a second wavelength spectrum of light. The organic image sensor may be configured to independently apply separate, respective voltages to separate organic photoelectric conversion devices of the plurality of organic photoelectric conversion devices to separately and independently configure the separate organic photoelectric conversion devices to generate separate, respective signals based on absorbing separate, respective wavelength spectra of incident light.

The separate, respective wavelength spectra of incident light may be different wavelength spectra of incident light.

The separate, respective voltages may be different voltages.

The organic image sensor may further include a common electrode on one side of each separate organic photoelectric conversion layer of the plurality of the organic photoelectric conversion devices and separate, respective pixel electrodes of a plurality of pixel electrodes on an opposite side of each separate organic photoelectric conversion layer of the plurality of the organic photoelectric conversion devices.

The organic image sensor may further include an inorganic photoelectric conversion device within a semiconductor substrate, wherein the plurality of organic photoelectric conversion devices are on the semiconductor substrate. The inorganic photoelectric conversion device may be configured to absorb a third light which is not absorbed by at least one organic photoelectric conversion device of the plurality of organic photoelectric conversion devices.

DETAILED DESCRIPTION

Hereinafter, some example embodiments will be described more fully with reference to the accompanying drawings. The described example embodiments may be modified in various different ways and not limited to the specific examples described herein, all without departing from the spirit or scope of the present inventive concepts.

Figure 1:
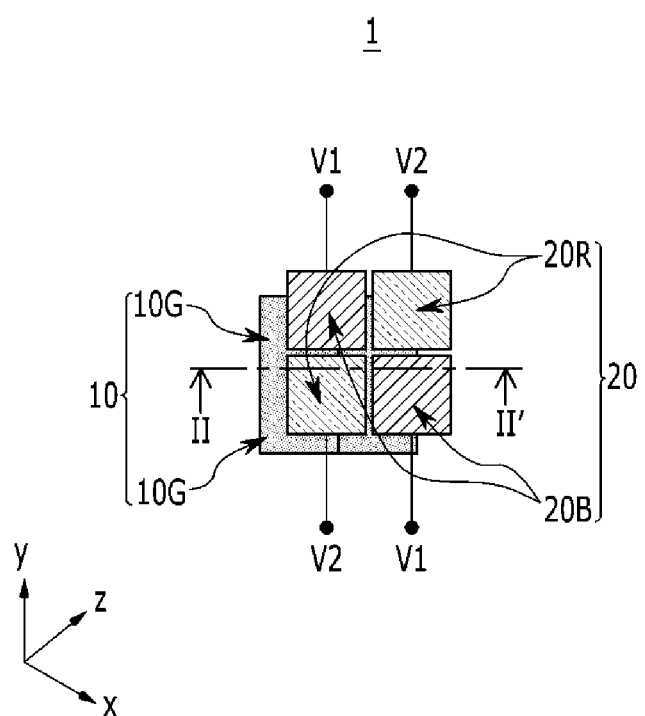
FIG. 1 is a schematic view showing a pixel arrangement of an image sensor according to some example embodiments.
Figure 2:
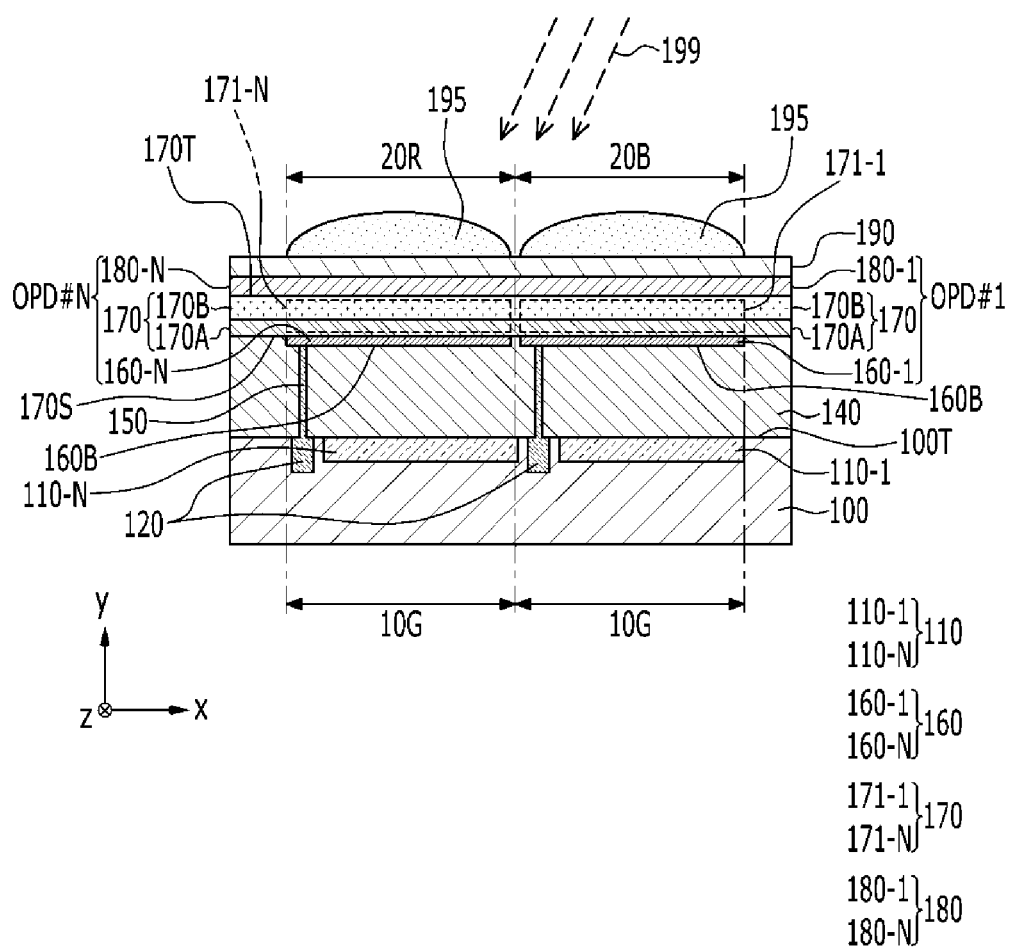
FIG. 2 is a cross-sectional view cut along with a II-II' line of FIG. 1 according to some example embodiments.
Figure 3:
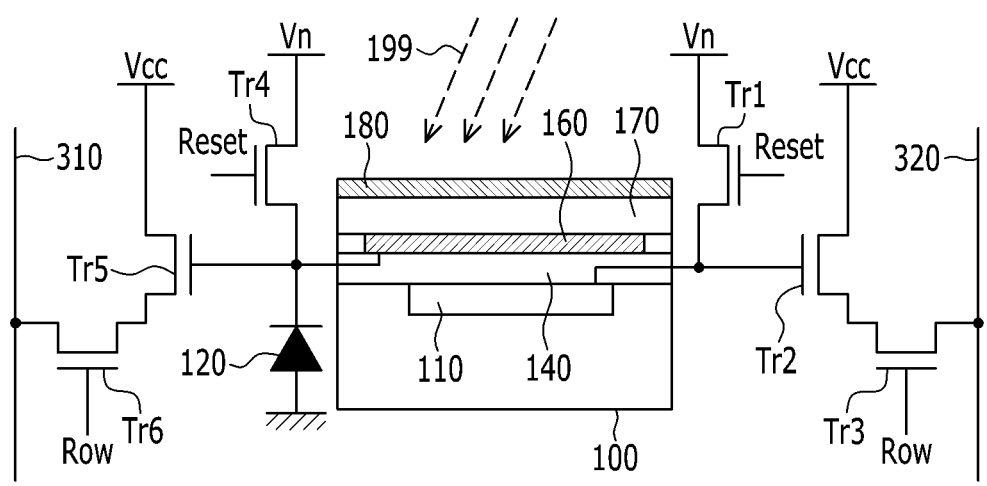
FIG. 3 is a schematic view showing a read out circuit of an image sensor according to some example embodiments.

FIG. 1 is a schematic view showing a pixel alignment of an image sensor according to some example embodiments. FIG. 2 is a cross-sectional view cut along with a II-II' line of FIG. 1 according to some example embodiments. FIG. 3 is a schematic view showing a read out circuit of an image sensor according to some example embodiments.

Referring to FIG. 1, an image sensor 1 according to some example embodiments includes an inorganic pixel array 10 in which a first pixel 10G for detecting a first light (green light) is entirely arranged in a x-y direction and an organic pixel array 20 in which a second pixel 20B for detecting second light (blue light) and a third pixel (20R) for detecting third light (red light) are alternatively arranged in a x-y direction. The inorganic pixel array 10 and the organic pixel array 20 are stacked in a z-direction.

In a normal operation mode, a second pixel 20B and a third pixel 20R may be alternatively disposed in the same number, such that a ratio of second pixels 20B to third pixels 20R in the image sensor 1 may be 1/1. In some example embodiments, the second pixel 20B may be applied with a first voltage V1 to configured the second pixel 20B to detect second light (blue light), and the third pixel 20R may be applied with a second voltage V2 which is different from the first voltage V1 to configured the third pixel 20R to detect third light (red light). In some example embodiments, the second voltage V2 may be applied in the third pixel 20R concurrently (e.g., simultaneously) with the first voltage being applied in the second pixel 20B.

The specific operations thereof are described with references to FIG. 2 showing a cross-sectional view cut along with Line II-II' of FIG. 1 and FIG. 3 illustrating the operation principle.

Referring to FIG. 2, the image sensor 1 includes an inorganic photoelectric conversion device 110 formed on a semiconductor substrate 100 and providing ("defining") a first pixel 10G. In some example embodiments, including the example embodiments shown in FIG. 2, the inorganic photoelectric conversion device 110 may be at least partially embedded within the semiconductor substrate 100, such that the inorganic photoelectric conversion device 110 is at least partially located within a volume defined by the outer surfaces (e.g., upper surface 100T) of the semiconductor substrate 100. As further shown in FIG. 2, the inorganic photoelectric conversion device 110 may include a plurality (e.g., an array) of inorganic photoelectric conversion devices 110-1 to 110-N (where N may be a positive integer) in the semiconductor substrate 100.

The semiconductor substrate 100 is not limited to a substrate of which the whole is a semiconductor layer but may be an insulator substrate including a semiconductor layer on a surface where light is irradiated.

When the semiconductor substrate 100 is a n-type, the inorganic photoelectric conversion device 110 may include a p well layer formed thereon, a n layer formed in the p well layer, and a p layer for suppressing a dark current having a higher concentration of impurities than the n layer. The most of inorganic photoelectric conversion device 110 is formed with the n layer to accumulate a charge.

A charge accumulated in the inorganic photoelectric conversion device 110 is sensed using a readout circuit including a transistor having a 3-transistor structure or a 4-transistor structure, and the like.

An interlayer insulating layer 140 is provided on the semiconductor substrate 100 formed with the inorganic photoelectric conversion device 110, and an organic photoelectric conversion layer 170 is provided thereon.

As shown in FIG. 2, the organic photoelectric conversion layer 170 may be divided into multiple organic photoelectric conversion devices OPD #1 to OPD #N (where "N" is a positive integer) which may include, as shown in FIG. 2, a first organic photoelectric conversion device (OPD #1) for a second pixel 20B and a second organic photoelectric conversion device (OPD #N) for a third pixel 20R according to a combination of a common electrode 180 thereon and separate pixel electrode 160-1 to 160-N, of a plurality of pixel electrodes 160, formed in each pixel under the same. As shown in FIG. 2, the division between of the image sensor 1 into separate organic photoelectric conversion devices OPD #1 to OPD #N may be based upon the separate pixel electrodes 160-1 to 160-N defining the separate organic photoelectric conversion devices OPD #1 to OPD #N, such that each organic photoelectric conversion device includes a separate pixel electrode 160-1 to 160-N and a separate portion of each of the common electrode 180 and the organic photoelectric conversion layer 170. Restated, and as shown in FIG. 2, the plurality of pixel electrodes 160-1 to 160-N may define separate organic photoelectric conversion devices OPD #1 to OPD #N in the organic image sensor 1, such that, for example, where N is equal to or greater than 2, the first organic photoelectric conversion device OPD #1 includes a first pixel electrode 160-1 of the plurality of pixel electrodes 160, a first portion 171-1 of the organic photoelectric conversion layer 170 and a first portion 180-1 of the common electrode 180, and a separate, second organic photoelectric conversion device OPD #N may include a separate, second pixel electrode 160-N of the plurality of pixel electrodes 160, a separate, second portion 171-N of the organic photoelectric conversion layer 170 and a separate, second portion 180-2 of the common electrode 180. As further shown in FIG. 2, the common electrode 180 is on one side (e.g., upper surface 170T) of the organic photoelectric conversion layer 170, and the plurality of pixel electrodes 160 are on an opposite side (e.g., lower surface 170S) of the organic photoelectric conversion layer 170.

As described herein, an element that is "on" another element may be above or beneath the other element. Additionally, an element that is "on" another element may be "directly" on the other element such that the element directly contacts the other element, or the element may be "indirectly" on the other element such that the element is isolated from direct contact with the other element by one or more interposing spaces and/or structures.

In some example embodiments, the image sensor 1 is configured to independently apply the first voltage V1 to one organic photoelectric conversion device (e.g., the first organic photoelectric conversion device OPD #1) and apply the second voltage V2 to a separate organic photoelectric conversion device (e.g., a second organic photoelectric conversion device OPD #N where N is equal to or greater than 2), where the first voltage V1 and the second voltage V2 are applied concurrently (e.g., simultaneously) and independently of each other.

A planarization layer 190 that is transparent to incident light is formed on the common electrode 180. A microlens 195 is formed on the planarization layer 190 to focus the incident light onto each pixel in a site corresponding to each pixel.

Each pixel electrode 160-1 to 160-N is connected with a separate charge storage section 120 through a separate contact 150 filled in a via formed in an interlayer insulation layer 140. Restated, the image sensor 1 may include an interlayer insulation layer 140 between an upper surface 100T of the semiconductor substrate 100 and an exposed lower surface 170S of the organic photoelectric conversion layer 170, and separate, respective contacts 150 configured to couple (e.g., electrically couple) the separate, respective organic photoelectric conversion devices OPD #1 to OPD #N with separate, respective charge storage sections 120 in the semiconductor substrate 100. As shown in FIG. 2, the interlayer insulating layer may be directly on a lower surface 160B of the plurality of pixel electrodes 160 and an exposed lower surface 170S of the organic photoelectric conversion layer 170. It will be understood that the semiconductor substrate 100 may be referred to as being "on" the interlayer insulating layer 140, as an element that is "on" another element may be above or beneath the other element.

A charge accumulated in the inorganic photoelectric conversion device 110 and a charge accumulated in the charge storage section 120 are sensed using a readout circuit including a transistor having a 3-transistor structure or a 4-transistor structure, and the like.

Referring to FIG. 3, a charge accumulated in the inorganic photoelectric conversion device 110 is readout by a reset transistor Tr1 having a drain connected to the inorganic photoelectric conversion device 110 and a source connected to a power source Vn, an output transistor Tr2 having a gate connected to the drain of the reset transistor Tr1 and a source connected to the power source Vcc, and a row selective transistor Tr3 having a source connected to the drain of the output transistor Tr2 and a drain connected to the signal output line 320.

The charge accumulated in the charge storage section 120 is readout by a reset transistor Tr4 having a drain connected to the charge storage section 120 and a source connected to a power source Vn, an output transistor Tr5 having a gate connected to the drain of the reset transistor Tr4 and a source connected to the power source Vcc, and a row selective transistor Tr6 having a source connected to the drain of the output transistor Tr5 and a drain connected to the signal output line 310.

A charge generated and stored in the inorganic photoelectric conversion device 110 is converted to a signal corresponded to an amount of charge through the output transistor Tr2. When the row selective transistor Tr3 is turned on, the signal is output to the signal output line 320. After outputting the signal, the charge of the inorganic photoelectric conversion device 110 is reset by the reset transistor Tr1. If required, it may further include a delivery transistor (not shown) between the inorganic photoelectric conversion device 110 and the drain of the reset transistor Tr1.

When a bias voltage is applied between a pixel electrode 160-1 to 160-N and the common electrode 180 (e.g., the first voltage V1 and/or the second voltage V2), which may be referred to as applying a particular voltage to a particular organic photoelectric conversion device OPD #1 to OPD #N that includes the given pixel electrode 160-1 to 160-N, a charge is generated corresponding to light 199 (also referred to herein as "incident light") having entered the organic photoelectric conversion layer 170 and is transported to a given charge storage section 120 through a given contact 150 connected with the given pixel electrode 160-1 to 160-N. The charge stored in the charge storage section 120 is converted to a signal corresponding to an amount of charge through the output transistor Try. Such a signal may also be interpreted as being associated with one or more particular wavelength spectra of incident light 199 that is absorbed by the given organic photoelectric device. When the row selective transistor Tr6 is turned on, the signal is output to the signal output line 310. After outputting the signal, the charge of the charge storage section 120 is reset by the reset transistor Tr4. If required, it may further include a delivery transistor (not shown) between the charge storage section 120 and the drain of the reset transistor Tr4.

In the image sensor 1, the organic photoelectric conversion layer 170 may detect different lights from each other (e.g., may detect different wavelength spectra of incident light 199) depending upon different applied voltages (e.g., depending upon different magnitudes of voltage(s) applied to different organic photoelectric conversion device(s) that include different portions 171-1 to 171-N of the organic photoelectric conversion layer 170). As shown in FIG. 2, the organic photoelectric conversion layer 170 is formed by stacking layers (170A, 170B) having different ratios of blending a first material (also referred to herein as "material A") and a second material (also referred to herein as "material B") which have different light absorbance characteristics from each other, so as to be configured to detect different wavelength spectra of light according to the applied voltage. Restated, the first material may be configured to absorb a first wavelength spectrum of light, and the second material may be configured to absorb a second wavelength spectrum of light, and the first and second wavelength spectra may be different from each other. The first wavelength spectrum of light may be referred to herein as "first light" and the second wavelength spectrum of light may be referred to herein as "second light."

For example, the image sensor 1 may include a lower layer 170A including a higher ratio of the material B configured to absorb red light and having an excellent charge transport property and a upper layer 170B including a higher ratio of the material A configured to absorb blue light and having a low electric characteristic. Restated, the material composition of the lower layer 170A may include a first mixture of the first material and the second material, and the material composition of the upper layer 170B may include a second mixture of the first material and the second material, where the ratio of the first material to the second material in the first mixture is greater than 1/1 (e.g., 2/1), and the ratio of the first material to the second material in the second mixture is less than 1/1 (e.g., 1/2).

Figure 4:
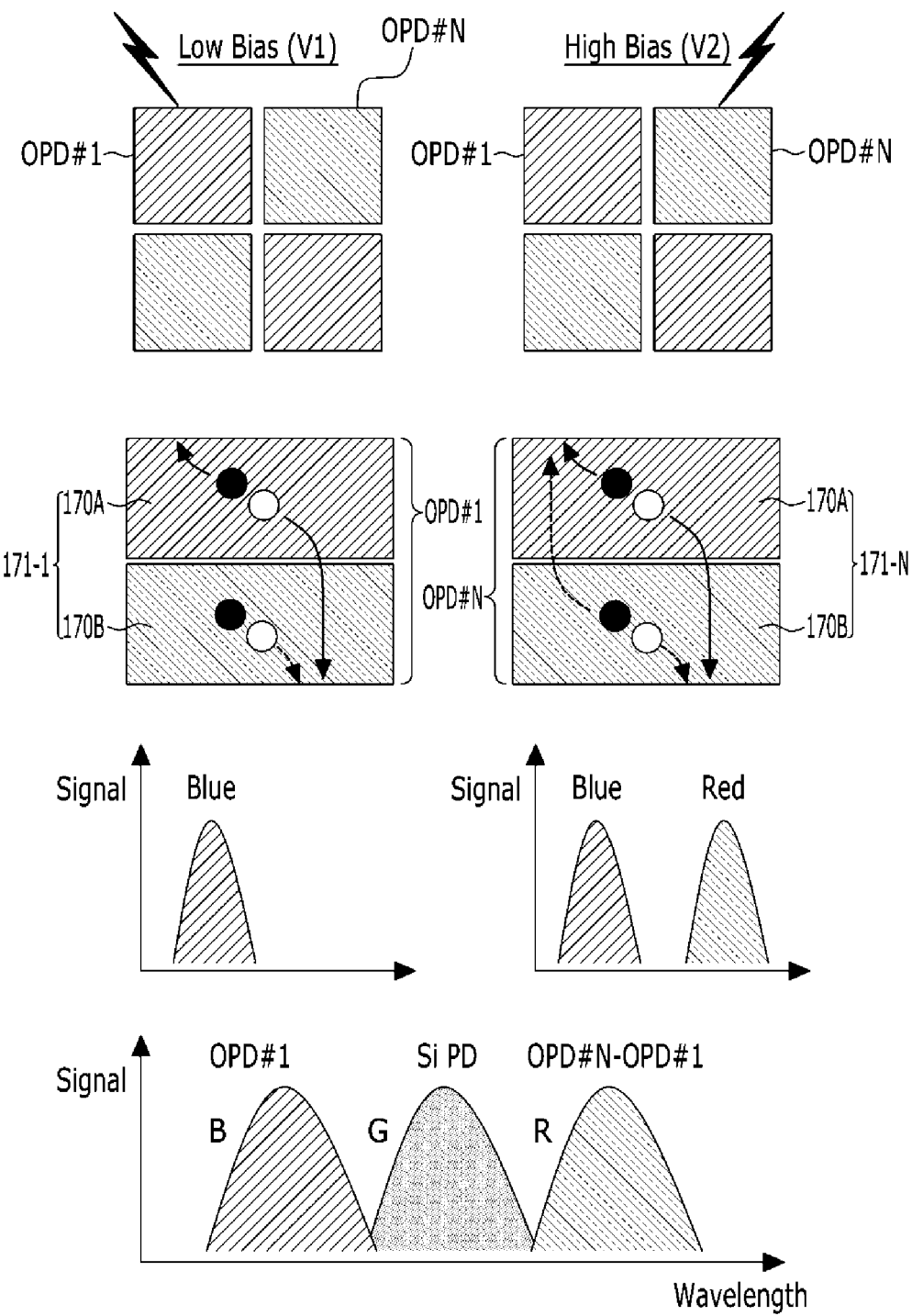
FIG. 4 is a schematic view illustrating an operation principle of an image sensor according to some example embodiments.

FIG. 4 is a schematic view illustrating an operation principle of an image sensor according to some example embodiments.

In some example embodiments, the second voltage V2 that may be applied in a second organic photoelectric conversion device OPD #N of the image sensor 1 (where N is equal to or greater than 2) may have a magnitude that is greater than a magnitude of the first voltage V1 that may be applied in a first organic photoelectric conversion device OPD #1 of the image sensor 1, such that the first voltage V1 may be referred to as a "low bias voltage" and the second voltage V2 may be referred to as a "high bias voltage."

In an example shown in FIG. 4, when a low voltage bias (V1) is applied to a first organic photoelectric conversion device OPD #1, a charge may be separated in both the lower layer 170A and the upper layer 170B of the first organic photoelectric conversion device OPD #1, but charges absorbing blue light (a portion of incident light 199 that is in the blue wavelength spectrum) are collected while being transported through the lower layer 170A having an excellent charge transport characteristic, on the other hand, charges absorbing red light (a portion of incident light 199 that is in the red wavelength spectrum) may be not transported through the upper layer 170B having a low charge transporting characteristic. Thereby, blue light may be detected by the first organic photoelectric conversion device OPD #1 based on the low voltage bias V1 being applied to the first organic photoelectric conversion device OPD #1, and a signal corresponding to said detection may be generated by the first photoelectric conversion device OPD #1. As further shown in FIG. 4, when a high voltage bias V2 is applied to the second organic photoelectric conversion device OPD #N, charges absorbing red light may be transported through the upper layer 170B having a charge transport characteristic, so both blue and red light (e.g., light in both the red and blue wavelength spectra) may be detected by the second organic photoelectric conversion device OPD #N, and the second organic photoelectric conversion device OPD #N may thus generate a signal that is based on the detection of both blue light and red light by the second organic photoelectric conversion device OPD #N. Accordingly, in some example embodiments, and as shown in FIG. 4, a blue signal (a signal indicating detection of blue light by the image sensor 1) may be obtained from the signal generated by the first organic photoelectric conversion device (OPD #1), and a red signal (a signal indicating detection of red light by the image sensor 1) may be obtained based on subtracting the signal generated by the first organic photoelectric conversion device (OPD #1) from the signal generated by the second organic photoelectric conversion device (OPD #N). Restated, and as described further with regard to FIGS. 5A-5C, a signal associated with one light of a first light and a second light may be obtained based on processing a signal generated by a first organic photoelectric conversion device OPD #1 applied with a first voltage V1, and a signal associated with the other light of the first light and the second light may be obtained based on processing a separate signal generated by a second organic photoelectric conversion device OPD #N applied with a separate, second voltage V2.

Restated, the image sensor 1 may be configured to 1) configure the first organic photoelectric conversion device OPD #1 to generate a signal associated with one light of the first light and the second light based on the image sensor applying a first voltage V1 to the first organic photoelectric conversion device OPD #1 and the image sensor 1 being irradiated with incident light 199 that includes the first light and the second light, and 2) configure the second organic photoelectric conversion device OPD #N to generate a signal associated with a separate light of the first light and the second light based on the image sensor applying a separate, second voltage V2 to the second organic photoelectric conversion device OPD #N and the image sensor 1 being irradiated with the incident light 199. The image sensor 1 may be configured to configured the first and second organic photoelectric conversion devices OPD #1 and OPD #N independently from each other, based on independently applying separate voltages to separate organic photoelectric conversion devices of the image sensor 1.

In order to increase the signal selectivity, the B material is blended with the A material in greater than or equal to about 3 times of the A material for the lower layer 170A, but for the upper layer 170B, the A material is blended with the B material in greater than or equal to about 3 times of the B material. Restated, a ratio of the first material to the second material in the first mixture that is the material composition of the lower layer 170A may be greater than 3/1, and a ratio of the first material to the second material in the second mixture that is the material composition of the upper layer 170B may be less than 1/3.

When the organic photoelectric conversion layer 170 is configured to absorb red light and blue light, (ZnPc, $C_{60}$) or (CuPc, $C_{60}$) may be used as a combination ("mixture") of the material A and the material B.

In some example embodiments, each inorganic photoelectric conversion device 110-1 to 110-N of the inorganic photoelectric conversion device 110 may be configured to absorb ("detect") a third light that is not absorbed by the first and second organic photoelectric conversion devices OPD #1 and OPD #N. When the organic photoelectric conversion layer 170 is configured to absorb red light and green light (light in the green wavelength spectrum), (BIDD Se, CuPc) or (SubPc, CuPc) may be used as a combination of the material A and the material B. In some example embodiments, the inorganic photoelectric conversion element 110 may be configured to absorb the blue light.

When the organic photoelectric conversion layer 170 is configured to absorb blue light and green light, (BIDD Se, $C_{60}$), (SubPc, $C_{60}$), or (DCV3T, C60) may be used as a combination of the material A and the material B. In some example embodiments, the inorganic photoelectric conversion element 110 may be configured to absorb the red light.

The image sensor 1 may have a selectivity to different two colors of RGB (two different wavelength spectra of red, green, and blue wavelength spectra) based on changing a voltage applied to at least a portion of the organic photoelectric conversion layer 170 (e.g., changing a voltage applied to an organic photoelectric conversion device that includes at least a portion 171-1 to 171-N of the organic photoelectric conversion layer 170. As the organic photoelectric conversion layer 170 already absorbs (also referred to herein as "detects") two different colors of RGB (e.g., two different wavelength spectra, of blue, red, and green wavelength spectra, of incident light 199), the remaining one color (wavelength spectrum) may be selectively delivered ("transmitted") to the inorganic photoelectric conversion device 110. Thereby, the image sensor 1 may omit ("may not include") any separate color filter ("color filter device"). In some example embodiments, in order to increase the selectivity to the remaining one color for the inorganic photoelectric conversion device 110, the depth of the inorganic photoelectric conversion device 110 in the semiconductor substrate 100 from the upper surface 100T of the semiconductor substrate 100 may be adjusted corresponding to a wavelength of the color ("wavelength spectrum" of incident light 199) to be detected. As referred to herein, it will be understood that a "color" may refer to a particular wavelength spectrum of incident light 199.

When a color filter is not included between the organic photoelectric conversion layer 170 and the inorganic photoelectric conversion device 110 of the image sensor 1, the distance between the organic photoelectric conversion layer 170 and the inorganic photoelectric conversion device 110 may be reduced to less than or equal to about 100 nm. The distance (for example, 500 nm) is shorter in less than or equal to at least about 1/5 times of a distance of a case that a color filter is existed between the organic photoelectric conversion layer 170 and the inorganic photoelectric conversion device 110. When the distance between the organic photoelectric conversion layer 170 and the inorganic photoelectric conversion device 110 is reduced to less than or equal to about 100 nm, the optical crosstalk may be reduced. In addition, as a depth of a via for the contact 150 formed in the interlayer insulation layer 140 is reduced, it is much facilitated to carry out a via forming process.

When the terms "around," "about," or "substantially" are used in this specification in connection with a numerical value, it is intended that the associated numerical value include a tolerance of ±10% around the stated numerical value. When ranges are specified, the range includes all values therebetween such as increments of 0.1%.

In addition, when the color filter itself is not included in the image sensor 1, the difficulties to provide a fine pattern of the color filter or to provide a thin film may be fundamentally solved.

Figure 5A:
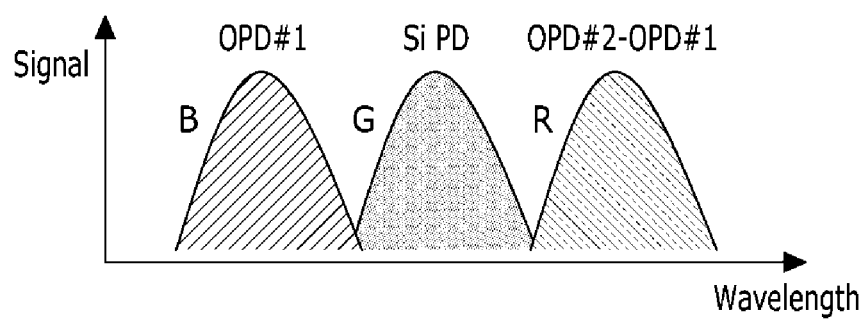
FIGS. 5A, 5B, and 5C are schematic views each showing a possible combination of color and a possible way of extracting signals according to some example embodiments.
Figure 5A:
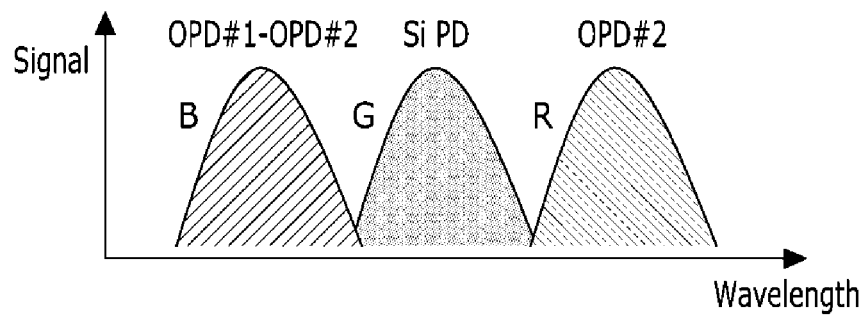
Figure 5B:
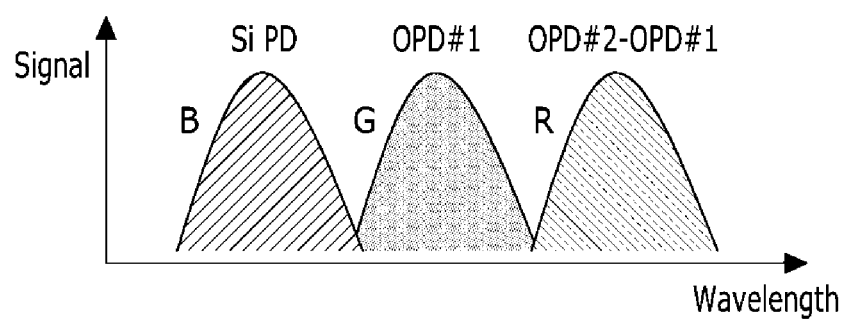
Figure 5B:
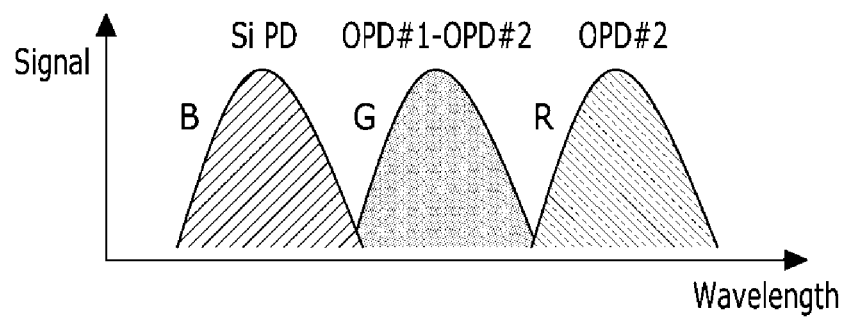
Figure 5C:
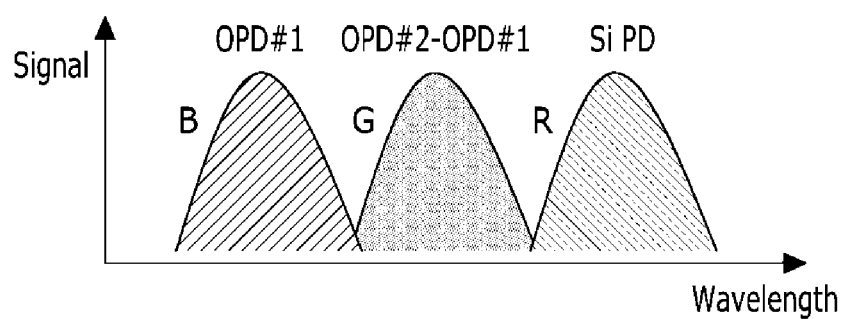
Figure 5C:
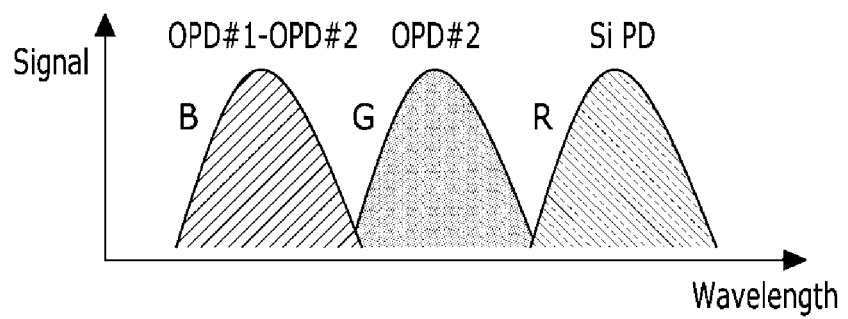

FIGS. 5A, 5B, and 5C are schematic views each showing a possible combination of colors (wavelength spectra of incident light 199) that various organic photoelectric conversion devices of the image sensor may be configured to detect and a possible way of extracting signals according to some example embodiments.

FIG. 5A shows some example embodiments of signals generated by an image sensor that includes an organic photoelectric conversion layer 170 configured to absorb red and blue light. As shown in the upper chart of FIG. 5A, when the image sensor detects blue light in the first organic photoelectric conversion device (OPD #1) and detects both blue light and red light in a second organic photoelectric conversion device (OPD #2), the signal generated by the first organic photoelectric conversion device (OPD #1) may be subtracted from the signal generated by the second organic photoelectric conversion device (OPD #2) to obtain a red signal, while the signal generated by the first organic photoelectric conversion device (OPD #1) may be the blue signal. As shown in the lower chart of FIG. 5A, when the image sensor detects red light in the second organic photoelectric conversion device (OPD #2) and detects blue light and red light in the first organic photoelectric conversion device (OPD #1), the signal generated by the second organic photoelectric conversion device (OPD #2) may be subtracted from the signal generated by the first organic photoelectric conversion device (OPD #1) to obtain a blue signal (B), while the signal generated by the second organic photoelectric conversion device (OPD #N) may be the red signal (R).

FIG. 5B shows some example embodiments of signals generated by an image sensor that includes an organic photoelectric conversion layer 170 configured to absorb green and red light. As shown in the upper chart of FIG. 5B, when the image sensor detects green light in the first organic photoelectric conversion device (OPD #1) and detects both green light and red light in the second organic photoelectric conversion device (OPD #2), the signal generated by the first organic photoelectric conversion device (OPD #1) may be subtracted from the signal generated by the second organic photoelectric conversion device (OPD #2) to obtain a red signal, while the signal generated by the first organic photoelectric conversion device (OPD #1) may be the green signal. As shown in the lower chart of FIG. 5B, when the image sensor detects red light in the second organic photoelectric conversion device (OPD #2) and detects both green light and red light in the first organic photoelectric conversion device (OPD #1), the signal generated by the second organic photoelectric conversion device (OPD #2) may be subtracted from the signal generated by the first organic photoelectric conversion device (OPD #1) to obtain a green signal, while the signal generated by the second organic photoelectric conversion device (OPD #2) may be the red signal.

FIG. 5C shows some example embodiments of signals generated by an image sensor that includes an organic photoelectric conversion layer 170 configured to absorb blue and green light. As shown in the upper chart of FIG. 5C, when the image sensor detects blue light in the first organic photoelectric conversion device (OPD #1) and detects both green light and blue light in the second organic photoelectric conversion device (OPD #2), the signal generated by the first organic photoelectric conversion device (OPD #1) may be subtracted from the signal generated by the second organic photoelectric conversion device (OPD #2) to obtain a green signal, while the signal generated by the first organic photoelectric conversion device (OPD #1) may be the blue signal. As shown in the lower chart of FIG. 5C, when the image sensor detects green light in the second organic photoelectric conversion device (OPD #2) and detects both green light and blues light in the first organic photoelectric conversion device (OPD #1), the signal generated by the second organic photoelectric conversion device (OPD #2) may be subtracted from the signal generated by the first organic photoelectric conversion device (OPD #1) to obtain blue signal, while the signal generated by the second organic photoelectric conversion device (OPD #2) may be the green signal.

Figure 6:
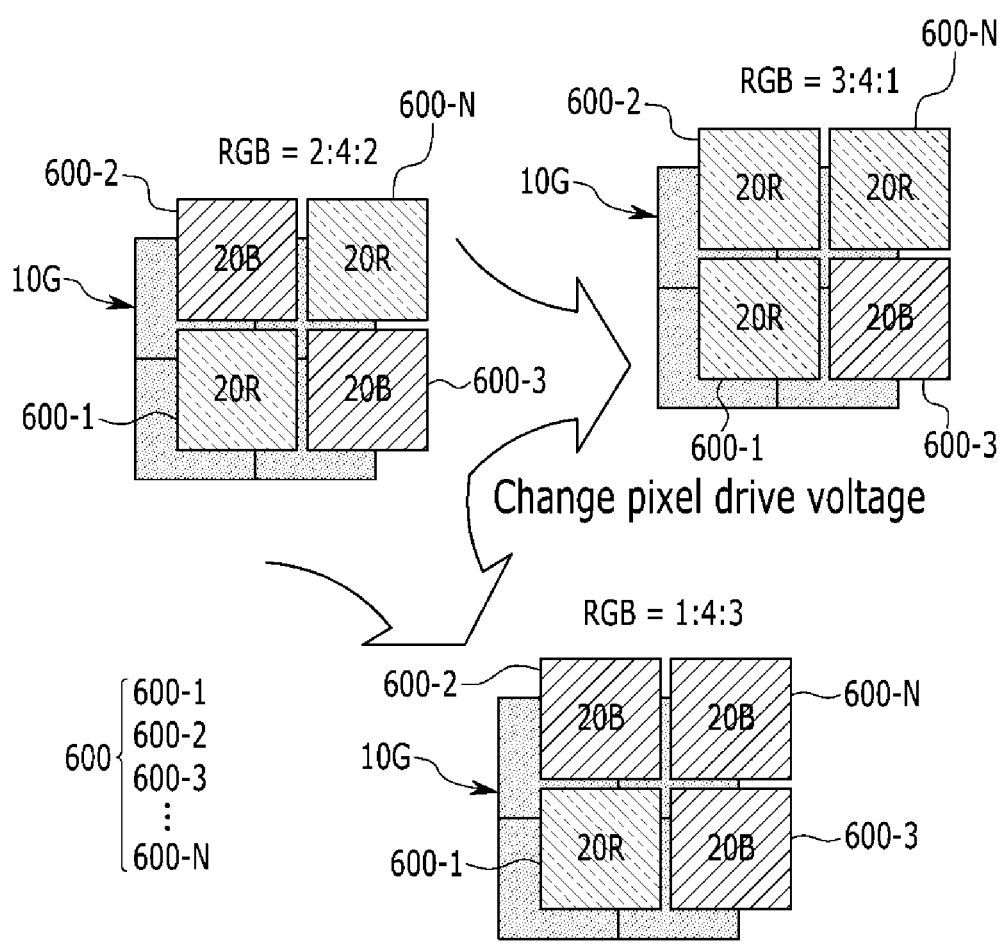
FIG. 6 is a view showing that a color ratio of a pixel may be adjusted according to an applied voltage according to some example embodiments.

FIG. 6 is a view showing that a color ratio of a pixel may be adjusted according to an applied voltage according to some example embodiments.

As shown in FIG. 6, an image sensor may include a pixel array 600 of pixels 600-1 to 600-N ("N" being a positive integer), where each separate pixel 600-1 to 600-N includes a separate organic photoelectric conversion device OPD #1 to OPD #N. In some example embodiments, and as shown in FIG. 6, the separate organic photoelectric conversion devices OPD #1 to OPD #N of the separate pixels 600-1 to 600-N of an image sensor 1 may be configured and/or re-configured to detect different wavelength spectra (different colors) of incident light 199 based on different voltages being applied to the separate organic photoelectric conversion devices OPD #1 to OPD #N, such that a color ratio (e.g., a ratio of the pixels configured to detect different wavelength spectra of light) of the image sensor 1 may be changed and/or controlled. As shown in a left side of FIG. 6, in a first (e.g., normal) operation mode, a ratio of a second pixel 20B of an image sensor detecting a second light (e.g., blue light) when applying a first voltage V1 to the organic photoelectric conversion device of the second pixel 20B is same as a ratio of a third pixel 20R detecting a third light (red light) by applying a second voltage V2 to the organic photoelectric conversion device of the third pixel 20R. Restated, and as shown in the left side of FIG. 6, a first voltage V1 may be applied to the organic photoelectric conversion devices of pixels 600-2 and 600-3 while a second voltage V2 may be applied to the organic photoelectric conversion devices of pixels 600-1 and 600-N, such that pixels 600-2 and 600-3 may be configured to detect blue light based on the applied first voltage V1 and pixels 600-1 and 600-N may be configured to detect red light based on the applied second voltage V2, and such that the ratio of the combined sensor areas of pixels configured to detect blue light (second pixels 20B) to the combined sensor areas of pixels configured to detect red light (third pixels 20R) may be 1/1.

In some example embodiments, including the example embodiments of the image sensor shown in the upper-right side of FIG. 6, when the operating voltage of a pixel is partially changed (e.g., the voltage applied to one or more organic photoelectric conversion devices OPD #1 to OPD #N of one or more pixels 600-1 to 600-N is changed), the ratio of the combined sensor areas of pixels configured to detect blue light (second pixels 20B) to the combined sensor areas of pixels configured to detect red light (third pixels 20R) may be reduced to be less than 1/1. In some example embodiments, including the example embodiments of the image sensor shown in the lower-right side of FIG. 6, when the operating voltage of a pixel is partially changed (e.g., the voltage applied to one or more organic photoelectric conversion devices OPD #1 to OPD #N of one or more pixels 600-1 to 600-N is changed), the ratio of the combined sensor areas of pixels configured to detect blue light (second pixels 20B) to the combined sensor areas of pixels configured to detect red light (third pixels 20R) may be increased to be greater than 1/1. Accordingly, the sensitivity of different organic photoelectric conversion devices OPD #1 to OPD #N of the image sensor to different wavelength spectra of incident light 199 may be separately and independently controlled.

In some example embodiments, a ratio of second pixels 20B to third pixels 20R in the image sensor 1 may refer to a ratio of a first set of one or more pixel electrodes 160-1 to 160-N to which a first voltage V1 is applied (based on the first voltage V1 being applied to the one or more organic photoelectric conversion devices OPD #1 to OPD #N that include said first set of one or more pixel electrodes 160-1 to 160-N) to a separate, second set of one or more pixel electrodes 160-1 to 160-N to which a separate, second voltage V2 is applied (based on the second voltage V2 being applied to the one or more organic photoelectric conversion devices OPD #1 to OPD #N that include said second set of one or more pixel electrodes 160-1 to 160-N). Such a ratio may be 1/1 when the image sensor 1 is operating in a normal operation mode, as shown in the left-side of FIG. 6, such that the combined sensor areas of the ratio of the combined sensor areas of pixels configured to detect blue light (second pixels 20B) to the combined sensor areas of pixels configured to detect red light (third pixels 20R) is 1/1, and such a ratio may be different from 1/1 when the image sensor 1 is operating in a mode other than the normal operation mode, as shown in the upper-right and lower-right sides of FIG. 6, such that the combined sensor areas of the ratio of the combined sensor areas of pixels configured to detect blue light (second pixels 20B) to the combined sensor areas of pixels configured to detect red light (third pixels 20R) is different from 1/1.

Although an organic and inorganic stacked structure is described in some example embodiments shown in FIGS. 1 to 6, all photoelectric conversion devices may be formed with an organic layer by changing the structure so that the first light is absorbed by another lower organic photoelectric conversion layer (not shown), besides the second light and the third light absorbed by the organic photoelectric conversion device.

Although, an image sensor which does not need a color filter by including an organic photoelectric conversion layer is described in some example embodiments shown in FIGS. 1 to 6, when more precise color separation is required, a color filter for the remaining light not detected by the organic photoelectric conversion layer may be provided on the inorganic photoelectric conversion element 110 to complete the image sensor.

Hereinafter, the present disclosure is illustrated in more detail with reference to experimental examples.

Experimental Example 1

Figure 7A:
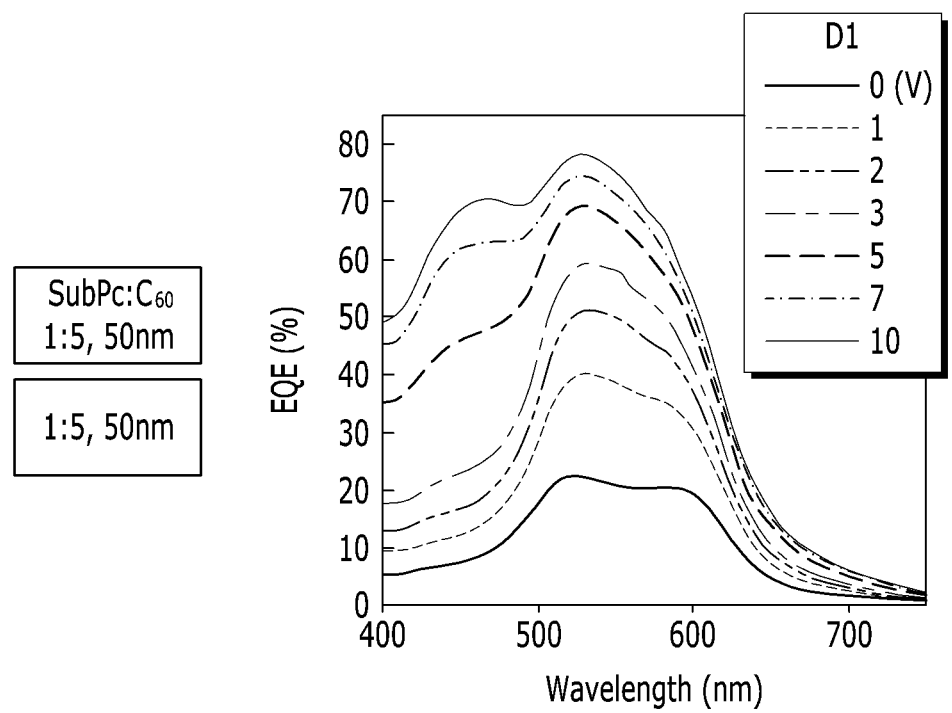
FIGS. 7A and 7B are graphs showing the results measured by an external quantum efficiency (EQE) of an organic photoelectric conversion layer formed by blending BIDD Se:$C_{60}$ according to an applied voltage and the results of simulating an external quantum efficiency for each wavelength using the same according to some example embodiments.
Figure 7B:
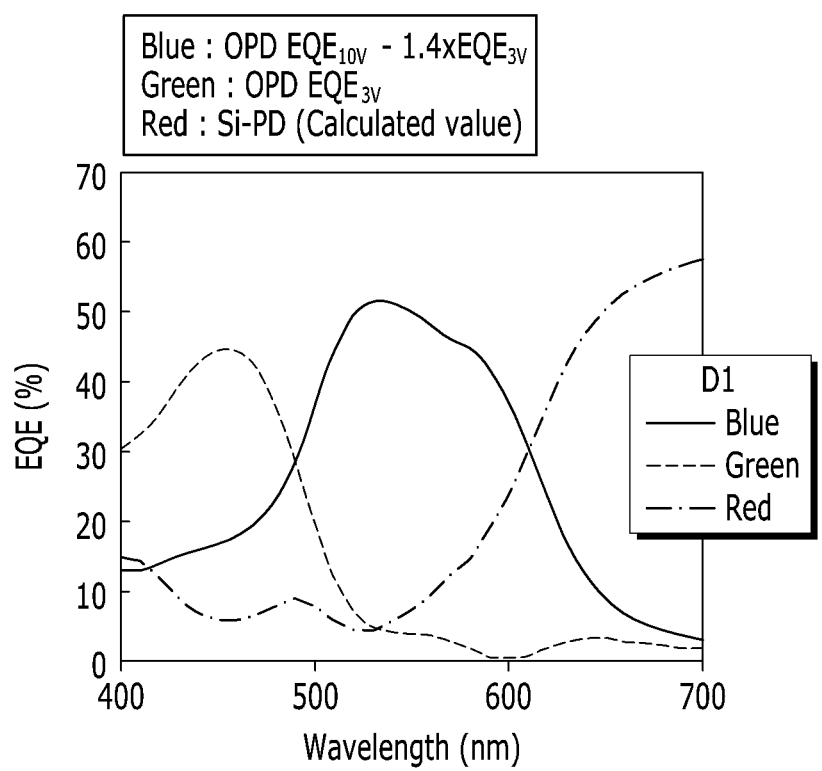

FIGS. 7A and 7B are graphs showing the results measured by an external quantum efficiency (EQE) of an organic photoelectric conversion layer formed by blending BIDD Se:$C_{60}$ according to an applied voltage and the results of simulating an external quantum efficiency for each wavelength using the same according to some example embodiments.

BIDD Se:$C_{60}$ are blended at 5:1 to provide a lower layer having a thickness of 50 nm, and BIDD Se:$C_{60}$ are blended at 1:5 to provide a upper layer having a thickness of 50 nm, so an organic photoelectric conversion layer is formed with the same. Subsequently, an external quantum efficiency (EQE (%)) is measured with chaining an applied voltage D1 to 0V, 1V, 2V, 3V, 5V, 7V, 10V. The results are shown in FIG. 7A. From the results of FIG. 7A, it is confirmed that green light is detected at a low voltage, and green light and blue light are detected at a high voltage.

The results of detecting green light is obtained from the external quantum efficiency from a voltage of 3V, the results of detecting blue light is obtained from subtracting 1.4 times of the external quantum efficiency at a voltage of 3V from the external quantum efficiency at voltage of 10V, and the result of simulating the red light detection result, which is filtered and not detected in the organic photoelectric conversion layer and is detected in the inorganic silicon photodiode, is shown together in FIG. 7B. Thereby, it is confirmed that an image sensor may be accomplished without a color filter by employing the organic photoelectric conversion layer.

Experimental Example 2

Figure 8A:
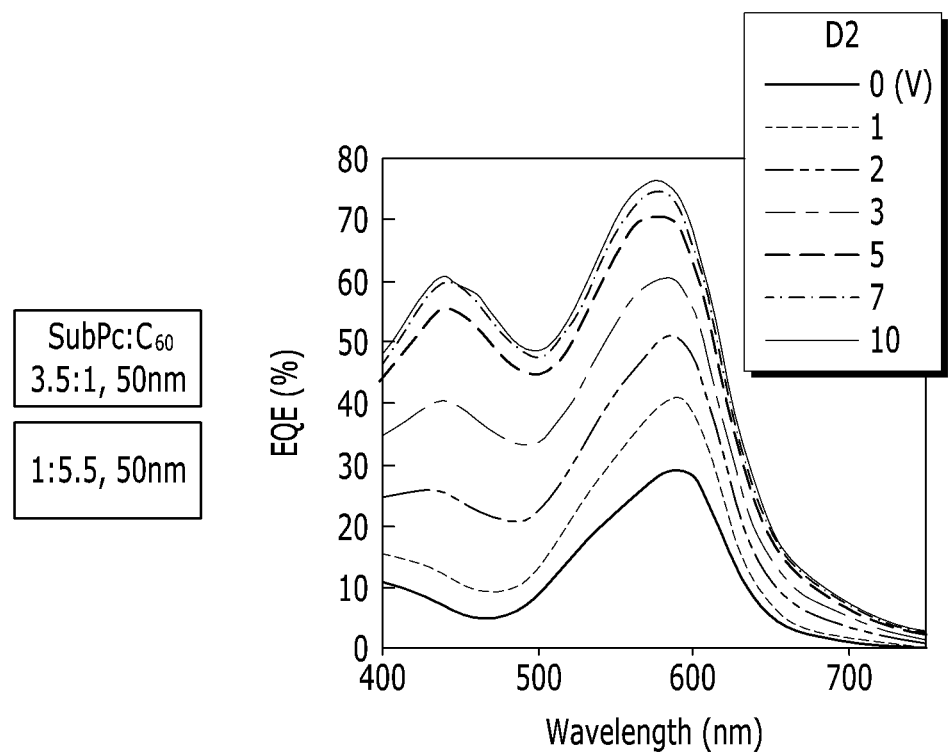
FIGS. 8A and 8B are graphs showing the results measured by an external quantum efficiency (EQE) of an organic photoelectric conversion layer formed by blending SubPc:$C_{60}$ according to an applied voltage and the results of simulating an external quantum efficiency for each wavelength using the same according to some example embodiments.
Figure 8B:
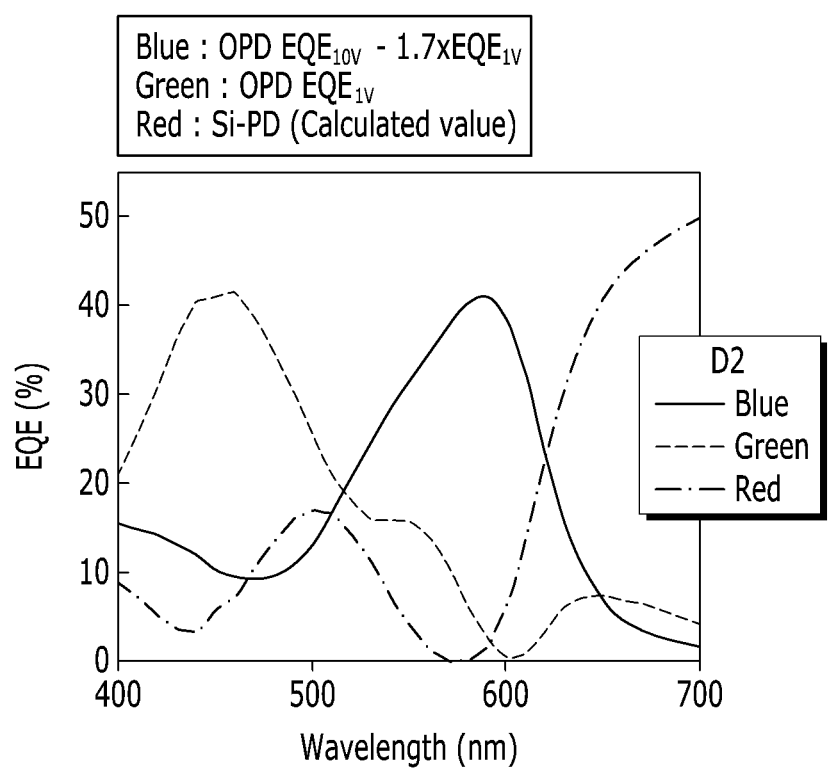

FIGS. 8A and 8B are graphs showing the results measured by an external quantum efficiency (EQE) of an organic photoelectric conversion layer formed by blending SubPc:$C_{60}$ according to an applied voltage and the results of simulating an external quantum efficiency for each wavelength using the same according to some example embodiments.

SubPc:$C_{60}$ are blended at 1:5.5 to provide a lower layer having a thickness of 50 nm, and SubPc:$C_{60}$ are blended at 3.5:1 to provide a upper layer having a thickness of 50 nm, so an organic photoelectric conversion layer comprising the same is formed. Subsequently, an external quantum efficiency (EQE (%)) is measured by changing an applied voltage D2 of 0V, 1V, 2V, 3V, 5V, 7V, 10V. The results are shown in FIG. 8A. From the results of FIG. 8A, it is confirmed that green light is detected at a low voltage, and green light and blue light are detected at a high voltage.

The results of detecting green light is obtained from the external quantum efficiency from a voltage of 1V, and the results of detecting blue light is obtained from subtracting 1.7 times of the external quantum efficiency at a voltage of 1V from the external quantum efficiency at voltage of 10V, and the result of simulating the red light detection result, which is filtered and not detected in the organic photoelectric conversion layer and is detected in the inorganic silicon photodiode, is shown together in FIG. 8B. Thereby, it is confirmed that an image sensor may be accomplished without a color filter by employing the organic photoelectric conversion layer.

Figure 9:
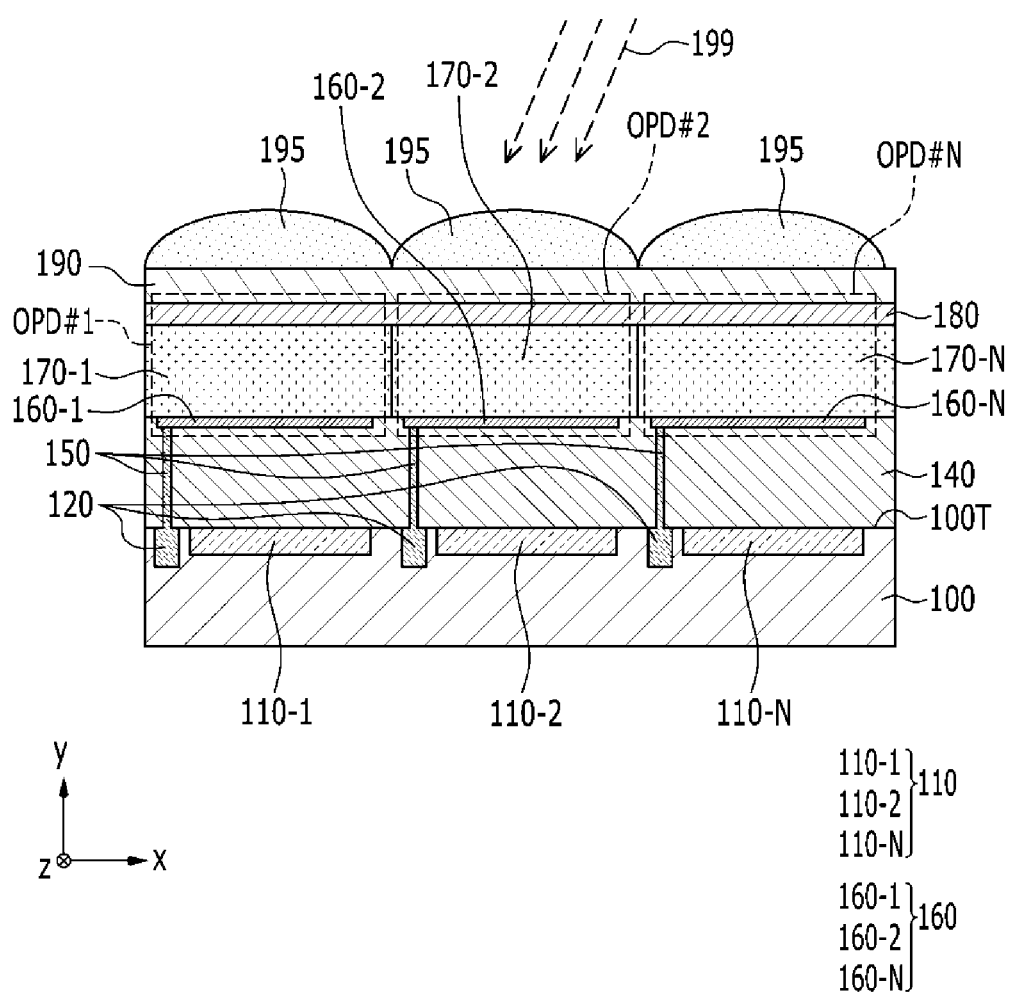
FIG. 9 is a cross-sectional view cut along with a II-II' line of FIG. 1 according to some example embodiments.

FIG. 9 is a cross-sectional view cut along with a II-II' line of FIG. 1 according to some example embodiments. Reference labels of elements in FIG. 9 that are common with reference labels of elements in FIG. 2 will be understood to refer to similar elements as the corresponding elements shown in FIG. 2, and a detailed description thereof with respect to FIG. 9 will not be provided here.

In some example embodiments, including the example embodiments shown in FIG. 9, an organic image sensor may include a plurality of organic photoelectric conversion devices OPD #1 to OPD #N (N being a positive integer), where each organic photoelectric conversion device of the plurality of organic photoelectric conversion devices OPD #1 to OPD #N includes a separate organic photoelectric conversion layer 170-1 to 170-N. As shown in FIG. 9, the separate organic photoelectric conversion layers 170-1 to 170-N may be coplanar or substantially coplanar with each other, such that each separate organic photoelectric conversion layer 170-1 to 170-N is at about a same distance from the semiconductor substrate 100. Each separate organic photoelectric conversion layer 170-1 to 170-N may include one or more layers, similarly to the lower layer 170A and upper layer 170B shown in FIG. 2, but example embodiments are not limited thereto. Different organic photoelectric conversion layers 170-1 to 170-N may include different quantities of stacked layers, a single layer, or the like. Each layer of the one or more layers of each separate organic photoelectric conversion layer 170-1 to 170-N may include a particular mixture of a first material (material A) and a second material (material B). Different organic photoelectric conversion layers 170-1 to 170-N may include different layers that include different mixtures of the first and second material.

One or more of the organic photoelectric conversion layers 170-1 to 170-N may include one or more materials that are not included in one or more other organic photoelectric conversion layers 170-1 to 170-N. Referring back to FIGS. 3-4, the organic image sensor 1 may be configured to independently apply separate, respective voltages to separate organic photoelectric conversion devices OPD #1 to OPD #N to separately and independently configure the separate organic photoelectric conversion devices to generate separate, respective signals based on absorbing separate, respective wavelength spectra of incident light 199.

In some example embodiments, such separate, respective wavelength spectra of incident light may be different wavelength spectra of incident light, such that separate organic photoelectric conversion devices OPD #1 to OPD #N may be controlled via independent application of separate voltages to separate organic photoelectric conversion devices to detect different wavelength spectra of incident light 199. In some example embodiments, the separate, respective voltages that may be applied to separate, respective organic photoelectric conversion devices OPD #1 to OPD #N may be different voltages.

As shown in FIG. 9, in some example embodiments, the organic image sensor 1 may include a common electrode 180 on one side of each separate organic photoelectric conversion layer 170-1 to 170-N of the plurality of the organic photoelectric conversion devices OPD #1 to OPD #N and separate, respective pixel electrodes 160-1 to 160-N of a plurality of pixel electrodes 160 on an opposite side of each separate organic photoelectric conversion layer 170-1 to 170-N of the plurality of the organic photoelectric conversion devices OPD #1 to OPD #N. But, it will be understood that, in some example embodiments, an organic image sensor may include multiple, separate common electrodes 180 on one side of the plurality of organic photoelectric conversion devices OPD #1 to OPD #N. For example, each separate photoelectric conversion devices OPD #1 to OPD #N may include a separate pixel electrode 160-1 to 160-N, a separate common electrode 180, or both a separate pixel electrode 160-1 to 160-N and a separate common electrode 180.

As further shown in FIG. 9, in some example embodiments, the organic image sensor 1 may include at least one inorganic photoelectric conversion device 110 within a semiconductor substrate 100, wherein the plurality of organic photoelectric conversion devices OPD #1 to OPD #N are on the semiconductor substrate 100. The at least one inorganic photoelectric conversion device 110 may be configured to absorb a third light which is not absorbed by at least one organic photoelectric conversion device of the plurality of photoelectric conversion devices OPD #1 to OPD #N. In some example embodiments, the inorganic photoelectric conversion device 110 may include a plurality of separate inorganic photoelectric conversion devices that are each aligned, in a direction extending normal to the upper surface 100T of the semiconductor substrate 100, with a separate organic photoelectric conversion device OPD #1 to OPD #N, and each given inorganic photoelectric conversion device 110 of said plurality may be configured to absorb ("detect") a particular wavelength spectrum of light that is not absorbed by the respective organic photoelectric conversion device with which the given inorganic photoelectric conversion device 110 is aligned in said direction extending normal to the upper surface 100T of the semiconductor substrate 100.

While this disclosure has been described in connection with what is presently considered to be practical example embodiments, it is to be understood that the inventive concepts are not limited to the disclosed example embodiments, but, on the contrary, is intended to cover various modifications and equivalent arrangements included within the spirit and scope of the appended claims.

DESCRIPTION OF SYMBOLS

110: semiconductor substrate
110: inorganic photoelectric conversion device
120: charge storage section
140: interlayer insulating layer
150: contact
160: pixel electrode
170: organic photoelectric conversion layer
170A: organic photoelectric conversion layer lower layer
170B: organic photoelectric conversion layer upper layer
180: common electrode
190: planarization layer
195: microlens

What is claimed is:

1. An organic image sensor, comprising:
an organic photoelectric conversion layer including a first material and a second material,
wherein the organic photoelectric conversion layer includes a lower layer and an upper layer stacked upon the lower layer, a material composition of the lower layer being a first mixture of the first and second materials, a material composition of the upper layer being a second mixture of the first and second materials,
wherein a ratio of the first material to the second material in the first mixture is greater than 1/1, and a ratio of the first material to the second material in the second mixture is less than 1/1,
wherein the first material is configured to absorb a first wavelength spectrum of light and the second material is configured to absorb a second wavelength spectrum of light,
wherein charges absorbing blue light are transported through the lower layer when a first voltage bias is applied to the organic image sensor to detect the blue light, charges absorbing red light are transported through the upper layer when a second voltage bias is applied to the organic image sensor to detect the blue light and the red light, and the second voltage bias is higher than the first voltage bias.

2. The organic image sensor of claim 1, wherein the ratio of the first material to the second material in the first mixture is greater than 3/1, and the ratio of the first material to the second material in the second mixture is less than 1/3.

3. The organic image sensor of claim 1, further comprising:
a common electrode on one side of the organic photoelectric conversion layer and a plurality of pixel electrodes on an opposite side of the organic photoelectric conversion layer,
wherein the plurality of pixel electrodes define separate, first and second organic photoelectric conversion devices in the organic image sensor, such that
the first organic photoelectric conversion device includes a first pixel electrode of the plurality of pixel electrodes, a first portion of the organic photoelectric conversion layer and a first portion of the common electrode, and
the second organic photoelectric conversion device includes a separate, second pixel electrode of the plurality of pixel electrodes, a separate, second portion of the organic photoelectric conversion layer and a separate, second portion of the common electrode.

4. The organic image sensor of claim 3, wherein the organic image sensor is configured to apply a first voltage in the first organic photoelectric conversion device and apply a second voltage in the second organic photoelectric conversion device, wherein the first voltage and the second voltage are applied concurrently.

5. The organic image sensor of claim 4, wherein a magnitude of the second voltage is greater than a magnitude of the first voltage.

6. The organic image sensor of claim 3, wherein the organic image sensor is configured to
configure the first organic photoelectric conversion device to generate a signal associated with one wavelength spectrum of light of the first wavelength spectrum of light and the second wavelength spectrum of light based on the organic image sensor applying a first voltage to the first organic photoelectric conversion device and the organic image sensor being irradiated with incident light that includes the first wavelength spectrum of light and the second wavelength spectrum of light, and
configure the second organic photoelectric conversion device to generate a signal associated with a separate wavelength spectrum of light of the first wavelength spectrum of light and the second wavelength spectrum of light based on the organic image sensor applying a separate, second voltage to the second organic photoelectric conversion device and the organic image sensor being irradiated with the incident light.

7. An organic/inorganic stacked image sensor, comprising:
a plurality of inorganic photoelectric conversion devices within a semiconductor substrate;
an organic photoelectric conversion layer on the semiconductor substrate, the organic photoelectric conversion layer including a first material and a second material, the first material configured to absorb a first wavelength spectrum of light, the second material configured to absorb a second wavelength spectrum of light, wherein the organic photoelectric conversion layer includes a lower layer and an upper layer stacked upon the lower layer, a material composition of the lower layer being a first mixture of the first and second materials, a material composition of the upper layer being a second mixture of the first and second materials, wherein a ratio of the first material to the second material in the first mixture is greater than 1/1, and a ratio of the first material to the second material in the second mixture is less than 1/1; and first and second organic photoelectric conversion devices, the first organic photoelectric conversion device including a first portion of the organic photoelectric conversion layer and configured to absorb one wavelength spectrum of light of the first wavelength spectrum of light and the second wavelength spectrum of light, the second organic photoelectric conversion device including a separate, second portion of the organic photoelectric conversion layer and configured to absorb a separate wavelength spectrum of light of the first wavelength spectrum of light and the second wavelength spectrum of light, wherein each inorganic photoelectric conversion device of the plurality of inorganic photoelectric conversion devices is configured to absorb a third wavelength spectrum of light which is not absorbed by the first organic photoelectric conversion device and the second organic photoelectric conversion device, wherein the organic/inorganic stacked image sensor does not include any color filter device.

8. The organic/inorganic stacked image sensor of claim 7, wherein the ratio of the first material to the second material in the first mixture is greater than 3/1, and the ratio of the first material to the second material in the second mixture is less than 1/3.

9. The organic/inorganic stacked image sensor of claim 7, further comprising:

a common electrode on one side of the organic photoelectric conversion layer and a plurality of pixel electrodes on an opposite side of the organic photoelectric conversion layer, wherein the plurality of pixel electrodes define the separate, first and second organic photoelectric conversion devices in the organic/inorganic stacked image sensor, such that the first organic photoelectric conversion device includes a first pixel electrode of the plurality of pixel electrodes, the first portion of the organic photoelectric conversion layer and a first portion of the common electrode, and the second organic photoelectric conversion device includes a separate, second pixel electrode of the plurality of pixel electrodes, the separate, second portion of the organic photoelectric conversion layer and a separate, second portion of the common electrode.

10. The organic/inorganic stacked image sensor of claim 9, wherein the organic/inorganic stacked image sensor is configured to apply a first voltage in the first organic photoelectric conversion device and apply a second voltage in the second organic photoelectric conversion device, wherein the first voltage and the second voltage are applied concurrently.

11. The organic/inorganic stacked image sensor of claim 10, wherein a magnitude of the second voltage is greater than a magnitude of the first voltage.

12. The organic/inorganic stacked image sensor of claim 10, wherein the organic/inorganic stacked image sensor is configured to configure the first organic photoelectric conversion device to generate a signal associated with the one wavelength spectrum of light of the first wavelength spectrum of light and the second wavelength spectrum of light based on the organic/inorganic stacked image sensor applying the first voltage to the first organic photoelectric conversion device and the organic/inorganic stacked image sensor being irradiated with incident light that includes the first wavelength spectrum of light and the second wavelength spectrum of light, and configure the second organic photoelectric conversion device to generate a signal associated with the separate wavelength spectrum of light of the first wavelength spectrum of light and the second wavelength spectrum of light based on the organic/inorganic stacked image sensor applying the second voltage to the second organic photoelectric conversion device and the organic/inorganic stacked image sensor being irradiated with the incident light.

13. The organic/inorganic stacked image sensor of claim 9, further comprising:

an interlayer insulation layer between an upper surface of the semiconductor substrate and an exposed lower surface of the organic photoelectric conversion layer; and a contact configured to couple the first organic photoelectric conversion device and the second organic photoelectric conversion device with a charge storage section on the semiconductor substrate.

14. The organic/inorganic stacked image sensor of claim 9, further comprising:

a planarization layer and a microlens array layer on the common electrode.

15. An organic image sensor, comprising:

an organic photoelectric conversion layer including a first material and a second material, wherein the organic photoelectric conversion layer includes a lower layer and an upper layer stacked upon the lower layer, a material composition of the lower layer being a first mixture of the first and second materials, a material composition of the upper layer being a second mixture of the first and second materials, wherein a ratio of the first material to the second material in the first mixture is greater than 1/1, and a ratio of the first material to the second material in the second mixture is less than 1/1;

a common electrode on one side of the organic photoelectric conversion layer; and a plurality of pixel electrodes on an opposite side of the organic photoelectric conversion layer, wherein the organic image sensor is configured to apply different voltages to separate pixel electrodes of the plurality of pixel electrodes, and wherein the first material is configured to absorb a first wavelength spectrum of light and the second material is configured to absorb a second wavelength spectrum of light, and wherein charges absorbing blue light are transported through the lower layer when a first voltage bias is applied to the organic image sensor to detect the blue light, charges absorbing red light are transported through the upper layer when a second voltage bias is applied to the organic image sensor to detect the blue light and the red light, and the second voltage bias is higher than the first voltage bias.

16. The organic image sensor of claim 15, wherein the organic image sensor is configured to operate in a normal operation mode, wherein
   a first voltage is applied to a first set of one or more pixel electrodes of the plurality of pixel electrodes,
   a second voltage is applied to a separate, second set of one or more pixel electrodes of the pixel electrodes, and
   a ratio of the first set of one or more pixel electrodes to the second set of one or more pixel electrodes is 1/1.

17. The organic image sensor of claim 16, wherein the organic image sensor is configured to operate in a mode different from the normal operation mode, wherein
   the ratio of the first set of one or more pixel electrodes to the second set of one or more pixel electrodes is different from 1/1.

18. An organic image sensor, comprising:
   an organic photoelectric conversion layer including a first material and a second material, the first material configured to absorb a first wavelength spectrum of light, the second material configured to absorb a second wavelength spectrum of light, wherein the organic photoelectric conversion layer includes a lower layer and an upper layer stacked upon the lower layer, a material composition of the lower layer being a first mixture of the first and second materials, a material composition of the upper layer being a second mixture of the first and second materials, wherein a ratio of the first material to the second material in the first mixture is greater than 1/1, and a ratio of the first material to the second material in the second mixture is less than 1/1;
   a common electrode on one side of the organic photoelectric conversion layer;
   a plurality of pixel electrodes on an opposite side of the organic photoelectric conversion layer;
   an interlayer insulating layer directly on a lower surface of the plurality of pixel electrodes and an exposed lower surface of the organic photoelectric conversion layer;
   a semiconductor substrate on the interlayer insulating layer, the semiconductor substrate including a charge storage section configured to store a charge accumulated in a first organic photoelectric conversion device and a second organic photoelectric conversion device;
   an inorganic photoelectric conversion device at least partially in the semiconductor substrate, the inorganic photoelectric conversion device configured to absorb a third light that is different from the first wavelength spectrum of light and the second wavelength spectrum of light; and
   a contact in the interlayer insulating layer, the contact configured to couple the first organic photoelectric conversion device and the second organic photoelectric conversion device with the charge storage section.

* * * * *